United States Patent
Chew et al.

(10) Patent No.: US 8,766,438 B2
(45) Date of Patent: Jul. 1, 2014

(54) PACKAGE STRUCTURE

(75) Inventors: Hwee-Seng Jimmy Chew, Singapore (SG); Chee Kian Ong, Singapore (SG); Kee Kwang Lau, Singapore (SG)

(73) Assignee: Advanpack Solutions PTE Ltd., Singapore (SG)

( * ) Notice: Subject to any disclaimer, the term of this patent is extended or adjusted under 35 U.S.C. 154(b) by 22 days.

(21) Appl. No.: 13/393,459

(22) PCT Filed: Sep. 1, 2009

(86) PCT No.: PCT/IB2009/006693
§ 371 (c)(1),
(2), (4) Date: Feb. 29, 2012

(87) PCT Pub. No.: WO2011/027185
PCT Pub. Date: Mar. 10, 2011

(65) Prior Publication Data
US 2012/0153465 A1 Jun. 21, 2012

(51) Int. Cl.
*H01L 23/48* (2006.01)
(52) U.S. Cl.
USPC .......... 257/737; 257/738; 257/E23.021; 257/E23.069
(58) Field of Classification Search
USPC .......... 257/737, 738, E23.021, E23–69, 257/780–782, 784, E23.069; 438/612–617
See application file for complete search history.

(56) References Cited

U.S. PATENT DOCUMENTS

| | | | | |
|---|---|---|---|---|
| 6,162,652 A * | 12/2000 | Dass et al. | | 438/18 |
| 7,928,583 B2 * | 4/2011 | Okumura et al. | | 257/778 |
| 2004/0124529 A1 * | 7/2004 | Hanaoka | | 257/738 |
| 2006/0073693 A1 | 4/2006 | Huang | | |
| 2006/0087040 A1 | 4/2006 | Shibasaki | | |
| 2007/0120269 A1 | 5/2007 | Hsieh et al. | | |
| 2007/0170556 A1 * | 7/2007 | Chung et al. | | 257/666 |
| 2008/0042275 A1 | 2/2008 | Kuan et al. | | |
| 2008/0124837 A1 * | 5/2008 | Takahira | | 438/108 |

FOREIGN PATENT DOCUMENTS

| TW | I275187 | 3/2007 |
|---|---|---|
| TW | I284969 | 8/2007 |
| WO | WO 9921226 | 4/1999 |

OTHER PUBLICATIONS

PCT/ISA/237 Written Opinion issued on PCT/IB2009//006693 (pp. 6).
PCT/ISA/210 Search Report issued on PCT/IB2009/006693 (pp. 3).

* cited by examiner

*Primary Examiner* — Jasmine Clark
(74) *Attorney, Agent, or Firm* — The Farrell Law Firm, P.C.

(57) ABSTRACT

The invention discloses a package structure including a semiconductor device, a first protection layer, a second protection layer and at least one conductive connector. The semiconductor device has at least one pad. The first protection layer is disposed on the semiconductor device and exposes the pad. The second protection layer, disposed on the first protection layer, has at least one first opening and at least one second opening. The first opening exposes a partial surface of the pad. The second opening exposes a partial surface of the first protection layer. The conductive connector, opposite to the pad, is disposed on the second protection layer and coupled to the pad through the first openings.

22 Claims, 7 Drawing Sheets

PACKAGE STRUCTURE

This application is the 35 U.S.C. §371 national stage of PCT application PCT/IB2009/006693, filed Sep. 1, 2009, the disclosure of which is hereby incorporated by reference.

BACKGROUND OF THE INVENTION

1. Field of the Invention

The invention relates in general to a package structure, and more particularly to a package structure having a second protection layer.

2. Description of the Related Art

Referring to FIG. 1, a conventional package structure having a repassivation layer is shown. An ordinary package structure 10 includes a semiconductor device 12, a passivation layer 14, a repassivation layer 16, a plurality of solder bumps 18, a substrate 20 and a sealant 22. The surface of the semiconductor device 12 has a plurality of pads 12a used as terminals for electrical connection. The surface of the semiconductor device 12 is further covered by the passivation layer 14 which provides protection function and exposes a part of the pads 12a.

Due to the smaller thickness, the ordinary passivation layer 14 may easily crack when receiving a force. In recent years, the repassivation layer 16 is further disposed on the passivation layer 14 of the package structure 10 to avoid the passivation layer 14 being cracked. The solder bumps 18 are connected to the semiconductor device 12 and the substrate 20 through a part of the exposed pads 12a. The sealant 22, interposed between the substrate 20 and the repassivation layer 16, encapsulates a plurality of solder bumps 18.

As the package is now being miniaturized, the minimum length of the pad 12a has been reduced to be smaller than 75 microns (μm). The package structure 10 formed by stacking the passivation layer 14 and the repassivation layer 16 further reduces the exposed area of the pads 12a, and the contact area between the solder bump 18 and the pads 12a is also reduced due to the repassivation layer 16. However, the force between the solder bumps 18 and the pads 12a increases as the contact area decreases, so that the package cannot pass the subsequent reliability test (such as temperature cycling). That is, the adhesion between the solder bumps 18 and the pad 12a decreases as the force increases, so that the solder bumps 18 cannot be tightly coupled to the pad 12a.

Besides, as the material of the repassivation layer 16 is softer, the adhesion between the repassivation layer 16 and the sealant 22 is lower, so that the repassivation layer 16 cannot be firmly coupled to the sealant 22 or the solder bumps 18, hence preventing the semiconductor device 12 from being fixed on the substrate 20 firmly.

SUMMARY OF THE INVENTION

The invention is directed to a package structure. By increasing the contact area between both the sealant and the conductive connector and the first protection layer, the adhesion force between both the sealant and the conductive connectors and the semiconductor device is enhanced for firmly fixing the semiconductor device on the substrate.

According to a first aspect of the present invention, a package structure including a semiconductor device, a first protection layer, a second protection layer and at least one conductive connector is provided. The semiconductor device has at least one pad. The first protection layer is disposed on the semiconductor device and exposes the pad. The second protection layer is disposed on the first protection layer and has at least one first opening and at least one second opening. The first opening exposes a partial surface of the pad. The second opening exposes a partial surface of the first protection layer. The conductive connector, opposite to the pad, is disposed on the second protection layer and coupled to the pad through the first openings.

According to a second aspect of the present invention, another package structure including a semiconductor device, a protection layer, a plurality of bumps and at least one conductive connector is provided. The semiconductor device has at least one pad. The protection layer is disposed on the semiconductor device and exposes a partial surface of the pad. A plurality of bumps are separately disposed on the protection layer for exposing a part of protection layer and the pad. At least one conductive connector disposed on the bumps and a part of the protection layer and coupled to the pad.

The invention will become apparent from the following detailed description of the preferred but non-limiting embodiments. The following description is made with reference to the accompanying drawings.

DETAILED DESCRIPTION OF THE INVENTION

First Embodiment

Figure 1:
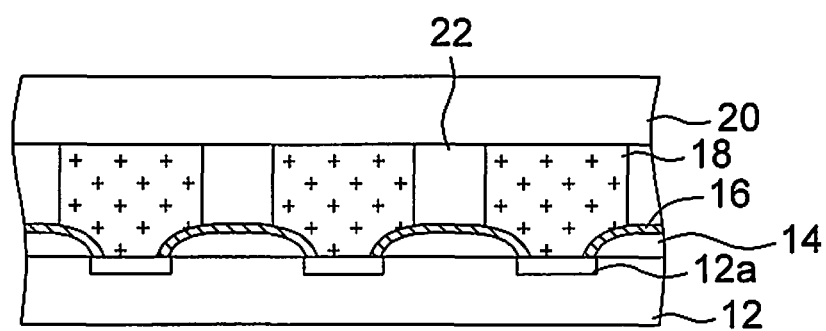
FIG. 1 shows a conventional package structure having a repassivation layer.
Figure 2:
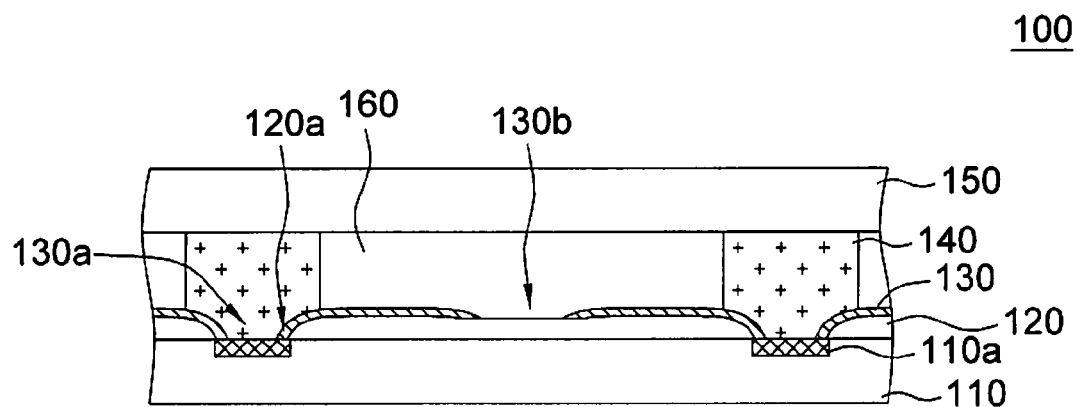
FIG. 2 shows a side view of a package structure according to a first embodiment of the invention.

Referring to FIG. 2, a side view of a package structure according to a first embodiment of the invention is shown. The package structure 100 includes a semiconductor device 110, a first protection layer 120, a second protection layer 130 and at least one conductive connector 140. The semiconductor device 110 has at least one pad 110a. The first protection layer 120 is disposed on the semiconductor device 110 and exposes the pad 110a. The second protection layer 130 is disposed on the first protection layer 120 and has at least one first opening 130a and at least one second opening 130b. The first opening 130a exposes a partial surface of the pad 110a. The second opening 130b exposes a partial surface of the first protection layer 120. The conductive connector 140, opposite to the pad 110a, is disposed on the second protection layer 130 and coupled to the pad 110a through the first opening 130a. For the convenience of elaboration, the semiconductor device 110 has two pads 110a and two conductive connectors 140 in the following embodiment.

In the present embodiment of the invention, the semiconductor device 110 is a chip and has a plurality of pads 110a. The first protection layer 120 is disposed on the semiconductor device 110 and has an opening 120a, which exposes a partial surface of the pads 110a. The second protection layer 130 is disposed on the first protection layer 120 for buffering the force received by the first protection layer 120. Besides, the second protection layer 130, opposite to the pad 110a, has a plurality of first openings 130a and exposes a partial surface of the pads 110a. Besides, in the present embodiment of the invention, the second protection layer 130 has a second opening 130b located outside the conductive connectors 140 for exposing a partial surface of the first protection layer 120.

In the present embodiment of the invention, for example, the thickness of the first protection layer 120 is smaller than 2 μm, the thickness of the second protection layer 130 is greater than 2 μm, the material of the first protection layer 120 differs with that of the second protection layer 130, and the hardness of the material of the first protection layer 120 substantially is harder than that of the second protection layer 130. The material of the first protection layer 120 is selected from a group of silicon nitride ($Si_yN_x$) and silicon oxide ($SiO_x$), such as the commonly seen silicon nitride ($Si_3N_4$) or silicon dioxide ($SiO_2$). The material of the second protection layer 130 is preferably a polymer, such as the commonly seen benzocyclobutane (BCB) and polyimide (PI).

In the present embodiment of the invention, the package structure 100 preferably further includes a substrate 150 and a sealant 160. The substrate 150 is coupled to the semiconductor device 110 through the conductive connectors 140. The sealant 160, interposed between the substrate 150 and the first protection layer 120, encapsulates the conductive connectors 140 and is coupled to the first protection layer 120 through the second opening 130b. As the hardness of the material of the second protection layer 130 is softer, the adhesion between the sealant 160 and the second protection layer 130 is weaker. Therefore, when the sealant 160 is coupled to the first protection layer 120 through the second opening 130b, the adhesion force of the sealant 160 is enhanced for fixing the semiconductor device 110. Thus, the semiconductor device 110 can be firmly coupled to the substrate 150. In the present embodiment of the invention, the substrate 150 can be a lead frame. However, the substrate 150 is not limited to a lead frame, and can be a glass substrate, a silicon substrate or a substrate of other material.

Figure 3:
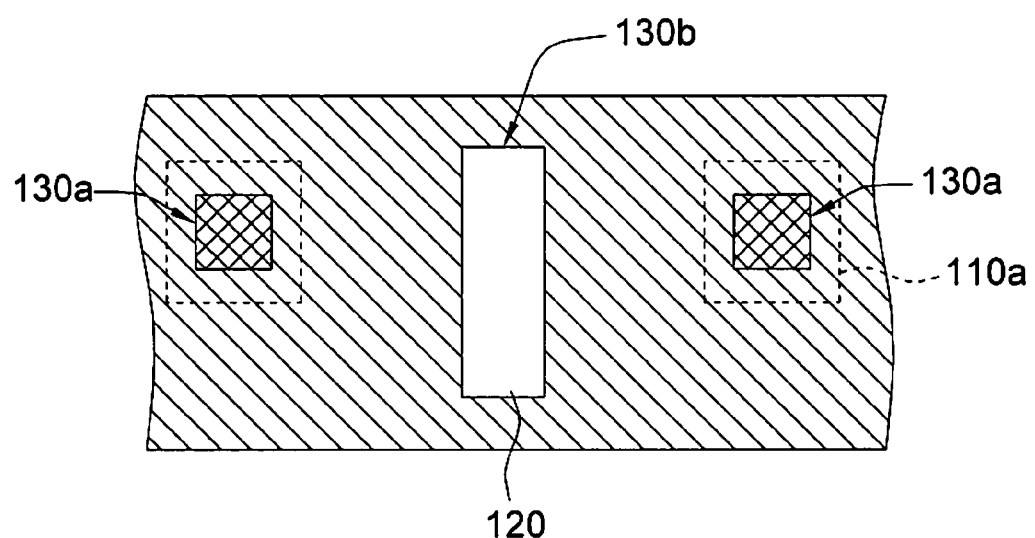
FIG. 3 shows a top view of a second protection layer of the package structure of FIG. 2.

Referring to FIG. 3, a top view of a second protection layer of the package structure of FIG. 2 is shown. In order to highlight the positions of the first opening 130a and the second opening 130b, a part of elements are omitted for the convenience of the following elaboration. Thus, the second protection layer 130 buffers the force received by the first protection layer 120, and the sealant 160 is coupled to the first protection layer 120 through the second opening 130b to enhance the adhesion force of the sealant 160 for fixing semiconductor device 110. To achieve the above effects at the same time, the sum of the area of the first opening 130a and the second opening 130b of the second protection layer 130 of the present embodiment of the invention substantially is greater than the area of the opening 120a of the first protection layer 120. Preferably, the ratio of the area of the second opening 130b to the area of the semiconductor device 110 substantially ranges between 20~99%. That is, by increasing the contact area between the sealant 160 and the first protection layer 120 within an appropriate ratio, the substrate 150 can be firmly coupled to the semiconductor device 110. Besides, as indicated in FIG. 2, the second opening 130b of the present embodiment of the invention is disposed on between two conductive connectors 140. In practical application, the sealant 160 can be coupled to the first protection layer 120 through the second opening 130b to enhance the adhesion as long as the second opening 130b of the present embodiment of the invention is located outside the conductive connector 140. Thus, there is no need to restrict the disposition position and the shape of the second opening 130b. However, anyone who is skilled in the technology of the invention will understand that the disposition method of the conductive connectors 140 and the pads 110a and is not limited thereto.

Second Embodiment

Figure 4:
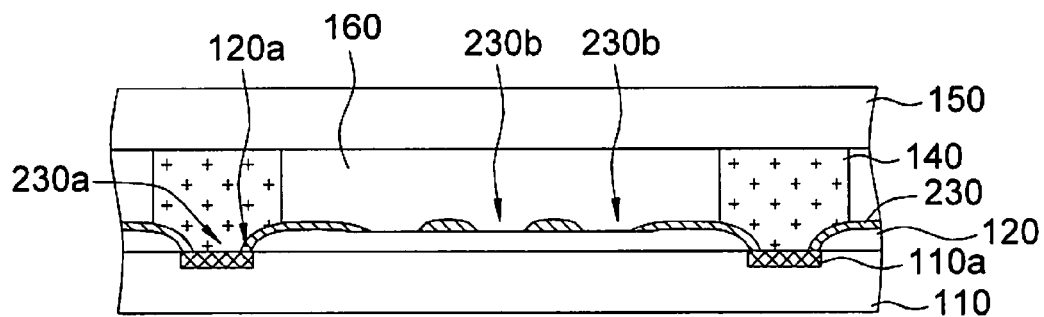
FIG. 4 shows a side view of a package structure according to a second embodiment of the invention.

The package structure 200 of the present embodiment of the invention differs with the package structure 100 of the first embodiment mainly in the quantity of the second opening 230b of the second protection layer 230, and other similarities are not repeated here. Referring to FIG. 4, a side view of a package structure according to a second embodiment of the invention is shown. In the present embodiment of the invention, the second protection layer 230 has a plurality of first openings 230a and a plurality of second openings 230b located outside the conductive connectors 140.

On the part of the second protection layer 230, a plurality of first openings 230a expose a partial surface of the pad 110a, and a plurality of second openings 230b expose a partial surface of the first protection layer 120, wherein the sealant 160 is coupled to the first protection layer 120 through a plurality of second openings 230b to enhance the adhesion force the sealant 160 for fixing the semiconductor device 110.

Figure 5:
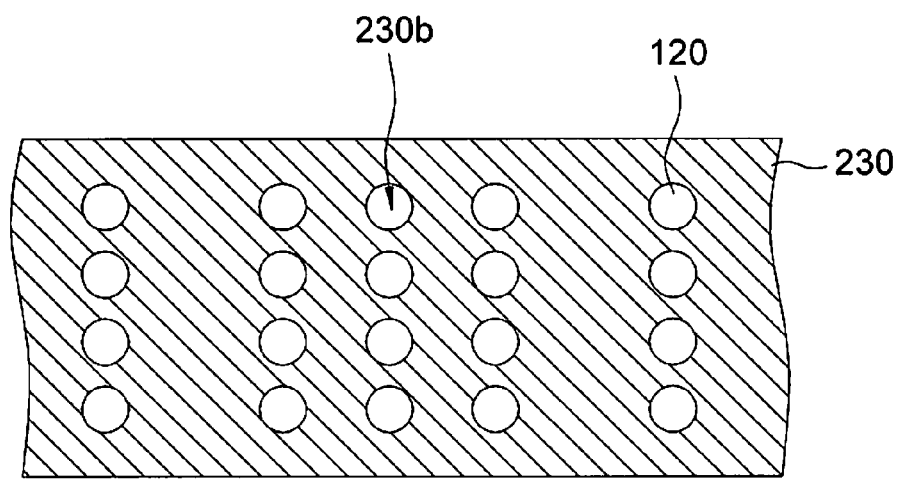
FIG. 5 shows a top view of a second protection layer of the package structure of FIG. 4.

Referring to FIG. 5, a top view of a second protection layer of the package structure of FIG. 4 is shown. Likewise, in order to highlight the second protection layer 230, a part of elements are omitted for the convenience of the following elaboration. In the present embodiment of the invention, the second protection layer 230 has a plurality of second openings 230b, which are arranged in a matrix. Like the first embodiment, for enabling the second protection layer 230 to effectively buffer the force received by the first protection layer 120, the sealant 160 is simultaneously coupled to the first protection layer 120 through the second opening 230b so as to enhance the adhesion force. The sum of the area of the first opening 230a and the second opening 230b of the second protection layer 230 of the present embodiment of the invention substantially is greater than the area of the opening 120a of the first protection layer 120. Preferably, the ratio of the area of the second opening 230b to the area of the semiconductor device 110 preferably ranges between 20~99%. However, the second openings 230b of the present embodiment of the invention can be interlaced in addition to the matrix arrangement. Anyone who is skilled in the technology of the invention will understand that the arrangement of the second opening 230b of the present embodiment of the invention is not limited to a matrix.

Third Embodiment

The package structure 300 of the present embodiment of the invention differs with the package structure 100 of the first embodiment mainly in the position of the second opening 330b of the second protection layer 330, and other similarities are not repeated here.

Figure 6:
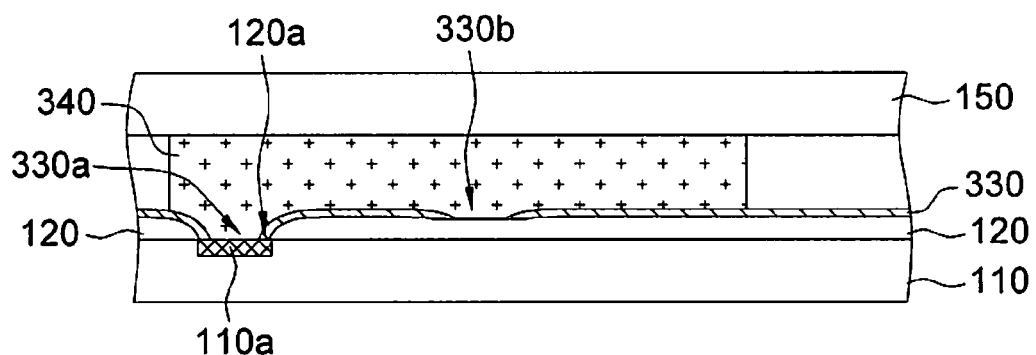
FIG. 6 shows a side view of a package structure according to a third embodiment of the invention.

Referring to FIG. 6, a side view of a package structure according to a third embodiment of the invention is shown. In the present embodiment of the invention, the second protection layer 330 has a second opening 330b located under the conductive connector 340, wherein the second opening 330b exposes a partial surface of the first protection layer 120. The conductive connector 340, opposite to the pad 110a, is disposed on the second protection layer 330 and coupled to the pad 110a through the first opening 330a and coupled to the first protection layer 120 through the second opening 330b. Thus, the adhesion force between the conductive connector 340 and the semiconductor device 110 is effectively enhanced for firmly fixing the semiconductor device 110 on the substrate 150.

Figure 7:
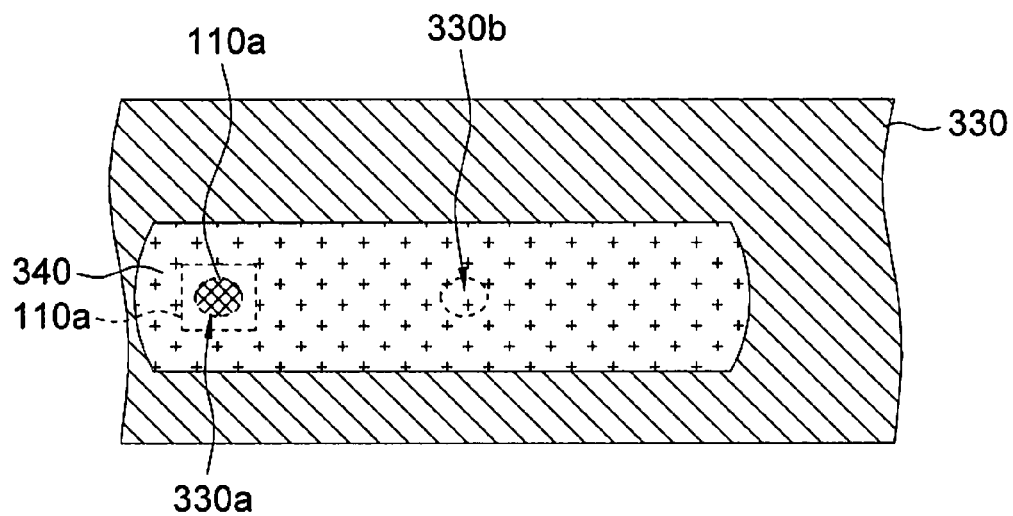
FIG. 7 shows a top view of the package structure of FIG. 6.

Referring to FIG. 7, a top view of the package structure of FIG. 6 is shown. Likewise, in order to highlight the second protection layer 330, a part of elements of the package structure 300 are omitted for the convenience of the following elaboration. In the present embodiment of the invention, the second protection layer 330 has a second opening 330b located under the conductive connector 340. Besides, for enabling the second protection layer 330 to effectively buffer the force received by the first protection layer 120, the conductive connector 340 is simultaneously coupled to the first protection layer 120 through the second opening 330b so as to enhance the adhesion force. Thus, the sum of the area of the first opening 330a and the second opening 330b of the second protection layer 330 of the present embodiment of the invention substantially is greater than the area of the opening 120a of the first protection layer 120. Preferably, the ratio of the area of the second opening 330b to the area of the semiconductor device 110 ranges between 20~99%. Besides, the second protection layer 330 of the present embodiment of the invention covers the first protection layer 120. In addition, the second protection layer 330 can be island-shaped and disposed on the first protection layer 120. Also, the second opening 330b can be a squared opening other than being a circular opening. Anyone who is skilled in the technology of the invention will understand that the shape of the second protection layer 330 as well as the shape and the size of the second opening 330b are not restricted in the present embodiment of the invention.

Fourth Embodiment

The package structure 400 of the present embodiment of the invention differs with the package structure 300 of the third embodiment mainly in the quantity of the second opening 430b of the second protection layer 430, and other similarities are not repeated here.

Figure 8:
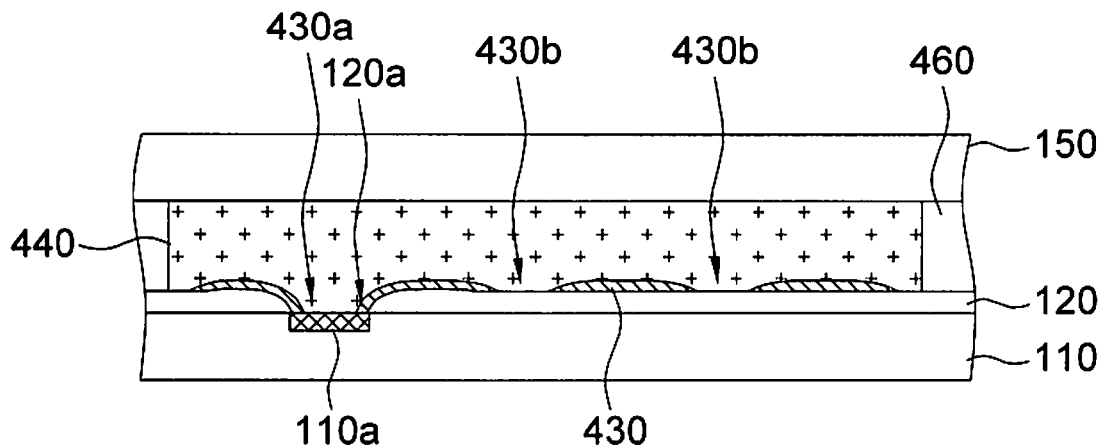
FIG. 8 shows a side view of a package structure according to a fourth embodiment of the invention.

Referring to FIG. 8, a side view of a package structure according to a fourth embodiment of the invention is shown. In the present embodiment of the invention the second protection layer 430 has a plurality of second openings 430b located under the conductive connector 440 for exposing a partial surface of the first protection layer 120. The conductive connector 440, opposite to the pad 110a, is disposed on the second protection layer 430, wherein the conductive connector 440 is coupled to the pads 110a through the first opening 430a and coupled to the first protection layer 120 through a plurality of second openings 430b. Thus, the adhesion between the conductive connectors 440 and the semiconductor device 110 is effectively enhanced for firmly fixing the semiconductor device 110 on the substrate 150.

Figure 9:
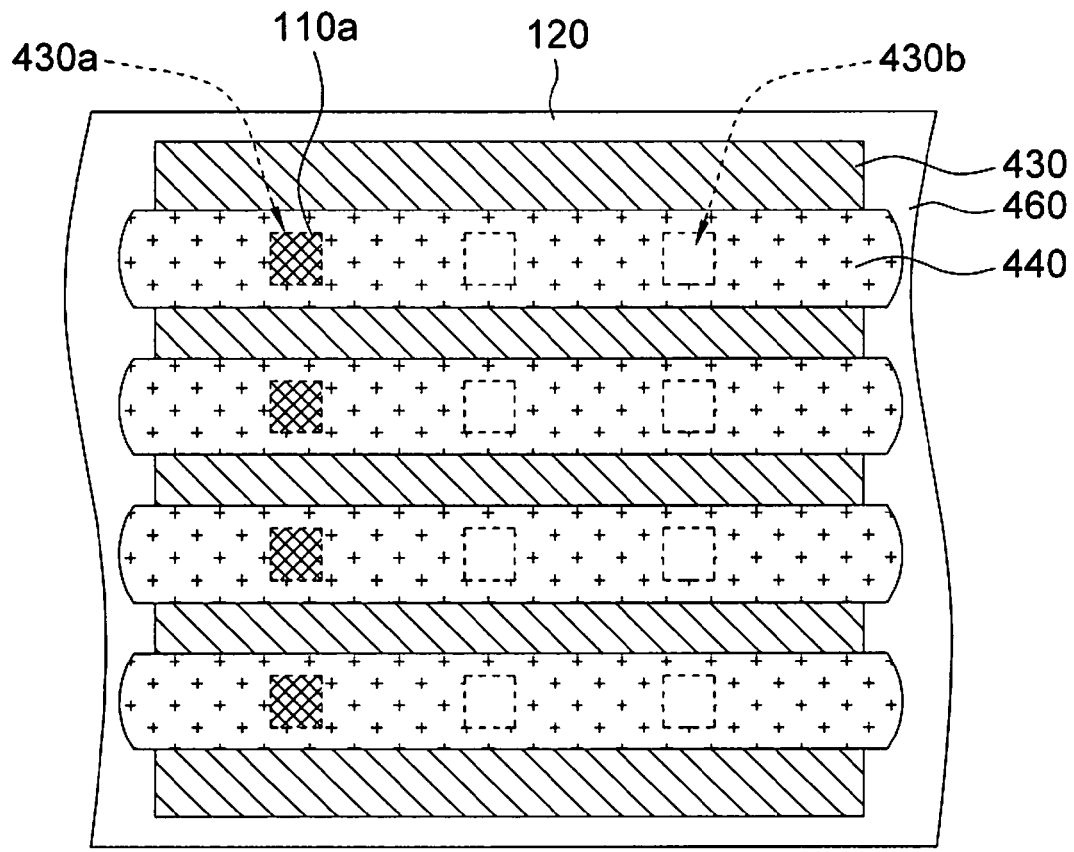
FIG. 9 shows a top view of the package structure of FIG. 8.

Referring to FIG. 9, a top view of the package structure of FIG. 8 is shown. Likewise, in order to highlight the second protection layer 430, a part of elements of the package structure 400 are omitted for the convenience of the following elaboration. In the present embodiment of the invention, the second protection layer 430 is island-shaped and disposed on the first protection layer 120, so that the conductive connectors 440 is not entirely located on the second protection layer 430, and can be partly located on the second protection layer 430 and partly located on the first protection layer 120. Thus, the sealant 460 can be directly coupled to the first protection layer 120 to enhance the adhesion between the substrate 150 and the semiconductor device 110.

Besides, the second protection layer 430 has a plurality of second openings 430b located under the conductive connectors 440, wherein the second openings 430b are arranged in a matrix for example. Thus, the conductive connector 440 can be coupled to the first protection layer 120 through a plurality of second openings 430b to enhance the cohesion between the conductive connectors 440 and the semiconductor device 110 for firmly fixing the semiconductor device 110 on the substrate 150. Besides, in the present embodiment of the invention, the island-shaped second protection layer 430 can have a plurality of conductive connectors 440 disposed thereon at the same time. However, an island-shaped second protection layer 430 can have only a conductive connector 440 disposed thereon. Also, in the present embodiment of the invention, the conductive connector 440 is not entirely located on the second protection layer 430, but is not limited thereto. The conductive connector 440 can be entirely located on the island-shaped second protection layer 430.

Likewise, for enabling the second protection layer 430 to effectively buffer the force received by the first protection layer 120, the conductive connector 440 is simultaneously coupled to the first protection layer 120 through the second opening 430b so as to enhance the adhesion force. In the present embodiment of the invention, the sum of the area of the first opening 430a and the second opening 430b of the second protection layer 430 substantially is greater than the area of the opening 120a of the first protection layer 120. Preferably, the ratio of the area of the second opening 430b to the area of the semiconductor device 110 ranges between 20~99%.

However, anyone who is skilled in the technology of the invention will understand that the invention is not limited to the above implementations. In the present embodiment of the invention, the second protection layer 430 can be island-shaped and disposed on the first protection layer 120 as illustrated in FIG. 9, and the second protection layer 330 can cover the first protection layer 120 as illustrated in FIG. 7. Besides, the second openings 430b of the second protection layer 430 can be arranged in a matrix like the present embodiment of the invention, or can be arranged in other ways such as being interlaced or alternated. That is, the second protection layer 430 and the openings 430b thereof can be disposed according to actual needs, and the shape of the second protection layer 430 as well as the disposition position and quantity of the second opening 430b and the opening thereof are not restricted.

Fifth Embodiment

The package structure 500 of the present embodiment of the invention differs with the fourth embodiment mainly in the position of the second opening 530b the second protection layer 530, and other similarities are not repeated here.

Figure 10:
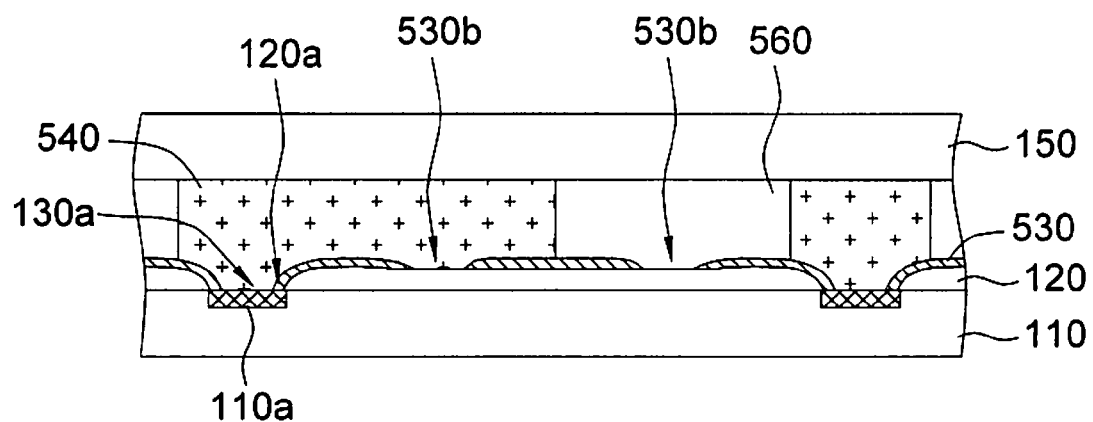
FIG. 10 shows a side view of a package structure according to a fifth embodiment of the invention.

Referring to FIG. 10, a side view of a package structure according to a fifth embodiment of the invention is shown. In the present embodiment of the invention, the second protection layer 530 has at least two second openings 530b, one is located outside the conductive connector 540 and the other is located under the conductive connector 540. Thus, the sealant 560 and the conductive connector 540 can be coupled to the first protection layer 120 through the second opening 530b for firmly fixing the semiconductor device 110 on the substrate 150.

Figure 11:
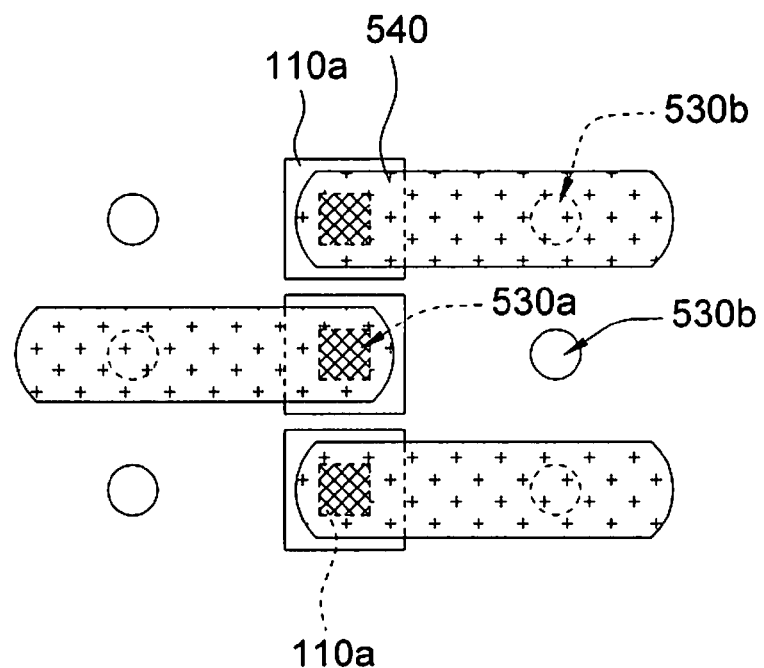
FIG. 11 shows an upward view of multiple conductive connectors of the package structure of FIG. 10.

Referring to FIG. 10 and FIG. 11 at the same time. FIG. 11 shows an upward view of multiple conductive connectors of the package structure of FIG. 10. Likewise, in order to highlight the conductive connector 540, a part of elements of the package structure 500 of FIG. 11 are omitted for the convenience of the following elaboration. In the present embodiment of the invention, the second protection layer 530 has a plurality of second openings 530b, which are arranged in a matrix, wherein a part of the second openings 530b are located under the conductive connector 540, and a part of the second openings 530b are located outside the conductive connector 540. Besides, the conductive connectors 540 are interlaced in the present embodiment of the invention. However, the invention is not limited to such arrangement, and other ways of arrangement can also do.

Likewise, for enabling the second protection layer 530 to effectively buffer the force received by the first protection layer 120, and the conductive connector 540 and the sealant 560 can be coupled to the first protection layer 120 through the second opening 530b so as to enhance the adhesion force. In the present embodiment of the invention, the sum of the area of the first opening 530a and the second opening 530b of the second protection layer 530 substantially is greater than the area of the opening 120a of the first protection layer 120. Preferably, the ratio of the area of the second opening 530b to the area of the semiconductor device 110 ranges between 20~99%.

Besides, in the present embodiment of the invention, the second protection layer 530 covers the first protection layer 120. Apart from that, the second protection layer 530 can also be island-shaped and disposed on the first protection layer 120. Also, the second opening 530b can be a squared opening other than being a circular opening. Anyone who is skilled in the technology of the invention will understand that the shape of the second protection layer 530 as well as the shape and the size of the second opening 530b are not restricted in the present embodiment of the invention.

Sixth Embodiment

The package structure 600 of the present embodiment of the invention differs with the above embodiments mainly in that a plurality of bumps 630 are used as a second protection layer, and other similarities are not repeated.

Figure 12:
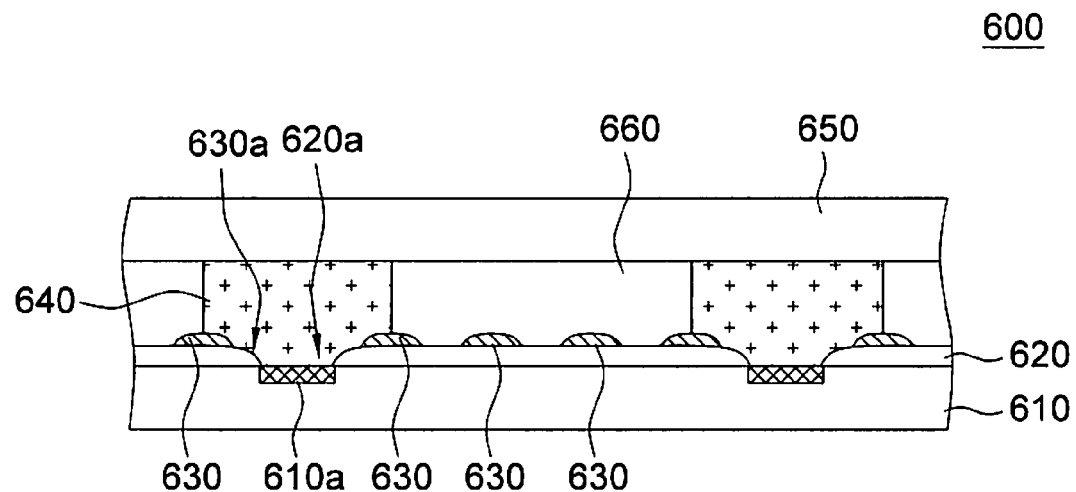
FIG. 12 shows a side view of a package structure according to a sixth embodiment of the invention.

Referring to FIG. 12, a side view of a package structure according to a sixth embodiment of the invention is shown. The package structure 600 includes a semiconductor device 610, a protection layer 620, a plurality of bumps 630 and at least one conductive connector 640. The semiconductor device 610 has at least one pad 610a. The protection layer 620 is disposed on the semiconductor device 610 and exposes a partial surface of the pad 610a. The bumps 630 are separately disposed on protection layer 620 for exposing a part of protection layer 620 and the pad 610a. The at least one conductive connector 640, opposite to the pad 610a, is disposed on the bumps 630 and a part of the protection layer 620 and coupled to the pad 610a. In the present embodiment of the invention, the bumps 630 are disposed on the protection layer 620 to buffer the force received by the protection layer 620. Besides, there is an opening 630a among the bumps 630 located under the conductive connector 640 for enabling the conductive connectors 640 to be electrically connected to the pad 610a through the opening 630a. The bumps 630 are separately disposed on protection layer 620 for exposing a partial surface of the protection layer 620.

In the present embodiment of the invention, for example, the thickness of the protection layer 620 is smaller than 2 μm, the thickness of the bumps 630 is greater than 2 μm, the material of the protection layer 620 differs with that of the bumps 630, and the hardness of the material of the protection layer 620 substantially is harder than that of bumps 630. The protection layer 620 is made from silicon nitride (SiN$_x$), and the bumps 630 are preferably made from a polymer such as the commonly seen benzocyclobutane (BCB) and polyimide (PI).

In the present embodiment of the invention, the package structure 600 further includes a substrate 650 and a sealant 660. The substrate 650 is coupled to the semiconductor device 610 through the conductive connectors 640. The sealant 660, interposed between the substrate 650 and the protection layer 620, encapsulates the conductive connector 640 and the bumps 630. As the hardness of the material of the bumps 630 is softer, the adhesion between the sealant 660 and the conductive connector 640 and the bumps 630 is weaker. When the sealant 660 and the conductive connector 640 are concurrently coupled to the bumps 630 and protection layer 620, the adhesion between the sealant 660 and the conductive connector 640 is enhanced for fixing the semiconductor device 610, so that the semiconductor device 610 can be firmly fixed on the substrate 650.

Figure 13:
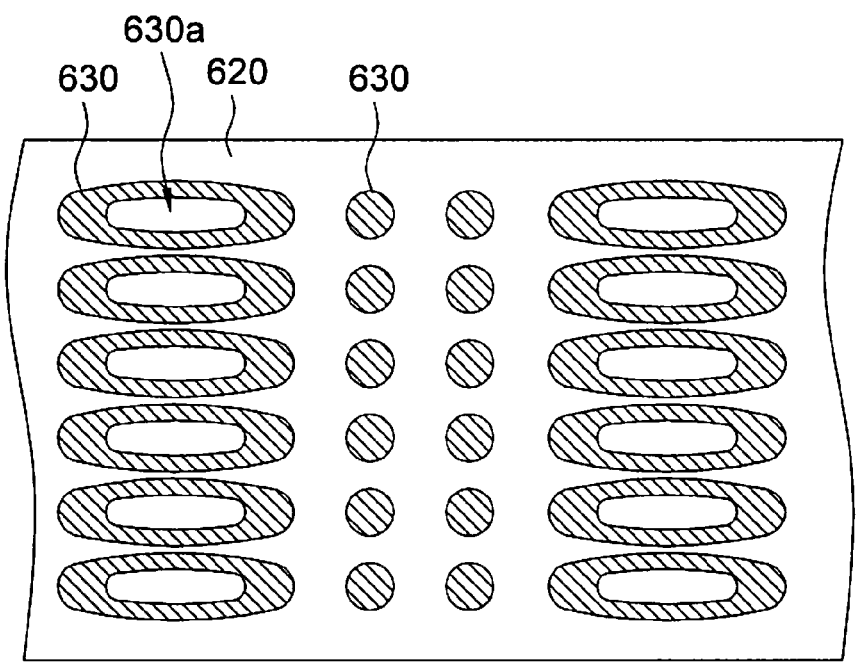
FIG. 13 shows an upward view of a protection layer and multiple bumps of the package structure of FIG. 12.

Referring to FIG. 13, an upward view of a protection layer and multiple bumps of the package structure of FIG. 12 is shown. In order to highlight the disposition of the bumps 630, a part of elements of the package structure 600 are omitted for the convenience of the following elaboration. Thus, the bumps 630 are disposed for buffering the force received by the protection layer 620. In the present embodiment of the invention, the area in which the bumps 630 are not disposed is slightly larger than the area of the opening 620a of the protection layer 620. Preferably the ratio of the area of the bumps 630 on the semiconductor device 610 to the area of the semiconductor device 610 substantially ranges between 1~80%.

Besides, in the present embodiment of the invention, the bumps 630 are arranged as a matrix on the protection layer. In practical application, the arrangement and disposition of the bumps 630 are not limited thereto, and the bumps 630 can also be alternated or interlaced. Moreover, the bumps 630a of the present embodiment of the invention can be an island-shaped structure and the circular protrusions can be squared bumps. Anyone who is skilled in the technology of the invention will understand that the invention is not limited thereto.

According to the package structure disclosed in the above embodiments of the invention, the contact area between the conductive connector and/or the sealant and the first protection layer is increased to enhance the adhesion between the conductive connector and/or the sealant and the semiconductor device. Thus, the second protection layer or the bump effectively buffers the force received by the first protection layer for firmly fixing the semiconductor device on the substrate.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A package structure comprising:
   a semiconductor device having at least one pad;
   a first protection layer disposed on the semiconductor device, wherein the first protection layer comprises at least one opening corresponding to and exposing the pad;
   a second protection layer disposed on the first protection layer, wherein the second protection layer comprises at least one first opening and at least one second opening, the first opening of the second protection layer corresponds to the opening of the first protection layer and exposes the pad, the second opening of the second protection layer is disposed away from the first opening of the second protection layer and exposes the first protection layer; and
   at least one conductive connector disposed on the second protection layer, wherein the conductive connector is coupled to the pad through the opening of the first protection layer and the first opening of the second protection layer.

2. The package structure according to claim 1, wherein the second opening is located away from the conductive connector.

3. The package structure according to claim 2, wherein the second protection layer has a plurality of second openings, the package structure further comprises:
   a substrate coupled to the semiconductor device through the conductive connector; and
   a sealant interposed between the substrate and the semiconductor device, wherein the sealant encapsulates the conductive connector and couples to the first protection layer through the plurality of second openings.

4. The package structure according to claim 1, wherein the second opening is located within the conductive connector and the conductive connector is coupled to the first protection layer through the second opening.

5. The package structure according to claim 4, wherein the second protection layer has a plurality of second openings, the package structure further comprises:
   a substrate coupled to the semiconductor device through the conductive connector; and
   a sealant interposed between the substrate and the semiconductor device, wherein the sealant encapsulates the conductive connector.

6. The package structure according to claim 1, wherein the second protection layer has at least two second openings, one is located away from the conductive connector and the other is located within the conductive connector.

7. The package structure according to claim 6, wherein package structure further comprises:
   a substrate coupled to the semiconductor device through the conductive connector; and
   a sealant interposed between the substrate and the second protection layer, wherein the sealant encapsulates the conductive connector and couples to the first protection layer through the second openings located away from the conductive connector.

8. The package structure according to claim 1, wherein the first protection layer has a plurality of openings, the second protection layer has a plurality of first openings and a plurality of second openings, and the first openings and the second openings of the second protection layer are substantially larger than the opening of the first protection layer.

9. The package structure according to claim 1, wherein the first protection layer and the second protection layer have different hardness.

10. The package structure according to claim 1, wherein the first protection layer is substantially harder than the second protection layer.

11. The package structure according to claim 1, wherein the first protection layer is formed from silicon nitride ($Si_yN_x$) or silicon oxide ($Si_yO_x$).

12. The package structure according to claim 1, wherein the second protection layer is formed from benzocyclobutane (BCB) or polyimide (PI).

13. A package structure comprising:
    a semiconductor device having at least one pad;
    a protection layer disposed on the semiconductor device, wherein the protection layer exposes the pad;
    a plurality of bumps disposed on the protection layer and partially covering the protection layer; and
    at least one conductive connector disposed on the protection layer and coupled to the pad, wherein the conductive connector is disposed on at least one bump on the protection layer.

14. The package structure according to claim 13, further comprising:
    a substrate coupled to the semiconductor device through the conductive connector; and
    a sealant interposed between the substrate and the semiconductor device, wherein the sealant encapsulates the conductive connector.

15. The package structure according to claim 13, wherein the protection layer comprises at least one opening, the opening exposes the pad and the conductive connector is coupled to the pad through the opening.

16. The package structure according to claim 13, wherein the bumps are substantially softer than the protection layer.

17. The package structure according to claim 13, wherein the protection layer is formed from silicon nitride ($Si_yN_x$) or silicon oxide ($Si_yO_x$).

18. The package structure according to claim 13, wherein the bumps are formed from benzocyclobutane (BCB) or polyimide (PI).

19. The package structure according to claim 13, wherein the at least one bump is disposed away from the conductive connector.

20. The package structure according to claim 13, wherein at least one bump is disposed within the conductive connector.

21. A package structure comprising:
    a semiconductor device having at least one pad;
    a protection layer disposed on the semiconductor device, wherein the protection layer exposes the pad;
    a plurality of bumps disposed on the protection layer and partially covering the protection layer;
    at least one conductive connector disposed on the protection layer and coupled to the pad;
    a substrate coupled to the semiconductor device through the conductive connector; and
    a sealant interposed between the substrate and the semiconductor device, wherein the sealant encapsulates the conductive connector and the plurality of bumps.

22. The package structure according to claim 21, wherein the bumps are formed from benzocyclobutane (BCB) or polyimide (PI).

* * * * *